(12) United States Patent
Liu et al.

(10) Patent No.: US 11,324,130 B2
(45) Date of Patent: May 3, 2022

(54) DISPLAY SCREEN MODULE AND DISPLAY SCREEN

(71) Applicant: UNILUMIN GROUP CO., LTD, Guangdong (CN)

(72) Inventors: Yuanxian Liu, Guangdong (CN); Kuang Yang, Guangdong (CN); Pinglin Zhao, Guangdong (CN)

(73) Assignee: UNILUMIN GROUP CO., LTD, Shenzhen (CN)

( * ) Notice: Subject to any disclaimer, the term of this patent is extended or adjusted under 35 U.S.C. 154(b) by 135 days.

(21) Appl. No.: 16/747,001

(22) Filed: Jan. 20, 2020

(65) Prior Publication Data
US 2020/0344898 A1    Oct. 29, 2020

(30) Foreign Application Priority Data
Apr. 25, 2019   (CN) .......................... 201920595516.3

(51) Int. Cl.
*H05K 5/00*   (2006.01)
*H05K 5/06*   (2006.01)
*H05K 5/02*   (2006.01)

(52) U.S. Cl.
CPC ............. *H05K 5/0017* (2013.01); *H05K 5/06* (2013.01); *H05K 5/0217* (2013.01)

(58) Field of Classification Search
None
See application file for complete search history.

(56) References Cited

U.S. PATENT DOCUMENTS

| 7,040,790 B2 * | 5/2006 | Lodhie | B60Q 1/2607 362/249.05 |
| 7,549,772 B2 * | 6/2009 | Wang | F21K 9/00 362/294 |
| 7,926,213 B1 * | 4/2011 | Kludt | H05K 5/0017 40/605 |
| 8,096,682 B2 * | 1/2012 | Lin | G09F 9/33 362/249.02 |
| 8,272,761 B2 * | 9/2012 | Lin | F21V 19/0055 362/249.02 |

(Continued)

FOREIGN PATENT DOCUMENTS

| CN | 200965758 Y | 10/2007 |
| CN | 101789205 A | 7/2010 |
| CN | 201845522 U | 5/2011 |

OTHER PUBLICATIONS

Search Report of counterpart European Patent Application No. 20160350.3 dated Sep. 4, 2020.

*Primary Examiner* — Anthony Q Edwards
*Assistant Examiner* — Rashen E Morrison

(57) ABSTRACT

The present disclosure provides a front maintenance display screen module, including: a bottom case, a PCB provided on the bottom case, and a through-hole structure penetrating the bottom case and the PCB. The through-hole structure includes a step structure at one end of the through hole structure near the PCB, and the step structure includes a convex portion and a step portion. The convex portion is configured to penetrate the PCB, a gap is provided between the convex portion and the PCB. The step portion includes a groove surrounding the convex portion. A side of the PCB near the bottom case is abutted against an edge of the groove. A sealant layer is provided in the gap and the groove.

14 Claims, 5 Drawing Sheets

(56) References Cited

U.S. PATENT DOCUMENTS

| | | | | |
|---|---|---|---|---|
| 9,972,229 | B2 * | 5/2018 | Hemiller | H05K 1/181 |
| 10,867,533 | B2 * | 12/2020 | Laforce | G09F 13/0413 |
| 2008/0060234 | A1 * | 3/2008 | Chou | G09F 9/33 40/452 |
| 2011/0176311 | A1 * | 7/2011 | Lin | G09F 9/33 362/249.02 |
| 2014/0043773 | A1 * | 2/2014 | Lin | H05K 7/10 361/728 |
| 2016/0320048 | A1 * | 11/2016 | Daniels | G09F 19/22 |
| 2019/0178479 | A1 * | 6/2019 | Liu | G03B 15/02 |
| 2020/0340585 | A1 * | 10/2020 | Li | F16J 15/061 |

* cited by examiner

DISPLAY SCREEN MODULE AND DISPLAY SCREEN

CROSS REFERENCE TO RELATED APPLICATIONS

The present application claims the benefit of Chinese Patent Application No. 201920595516.3 filed on Apr. 25, 2019. All the above are hereby incorporated by reference. the contents of which are incorporated herein by reference in their entirety.

TECHNICAL FIELD

The present disclosure relates to the technical field of display screens, in particular to a front maintenance display screen module and a display screen.

BACKGROUND

In a related art, an outdoor front maintenance LED display screen module needs to be provided with a through-hole structure penetrating through front and back surfaces of the bottom case, and a rotary handle placed at the rear end of the through-hole structure. A hexagonal wrench is used to drive the rotary handle rotate through the through-hole structure from the front of the module to realize the front maintenance function. Due to the need for waterproofing, the through-hole structure needs to pass through the printed circuit board (PCB), and the side of the through-hole structure is a closed structure. However, when the front maintenance hole passes through a thin PCB provided with a plurality of lamp beads close to each other, the module is very easy to be damaged during actual maintenance operations, and there will be a gap at the side wall of the front maintenance hole, causing that external moisture will enter the internal of the module through the gap.

SUMMARY

The main objective of the present disclosure is to provide a front maintenance display screen module with excellent waterproof performance and a display screen having the front maintenance display screen module.

In order to achieve the above objective, the present disclosure provides a display screen module, including: a bottom case, a PCB provided on the bottom case, and a through-hole structure penetrating through the bottom case and the PCB. The through-hole structure includes a step structure at one end of the through hole structure near the PCB, and the step structure includes a convex portion and a step portion. The convex portion is configured to penetrate the PCB, a gap is provided between the convex portion and the PCB. The step portion includes a groove surrounding the convex portion. A side of the PCB near the bottom case is abutted against an edge of the groove. A sealant layer is provided in the gap and the groove.

Further, the convex portion includes at least one arc structure protruded from an outer side wall of the convex portion.

Further, the PCB includes a through hole; the convex portion is located in the through hole; the through hole includes a first notch corresponding to the arc structure, the first notch is arc-shaped; and a radius of the first notch is larger than that of the arc structure.

Further, the first notch is also provided with a second notch.

Further, a plurality of lamp beads are provided on the PCB, and the first notch is located between two adjacent lamp beads.

Further, an outer diameter of the groove is larger than a diameter of the through hole.

Further, a rounded corner is provided at a joint between the convex portion and the groove.

Further, the through-hole structure is integrally formed with the bottom case.

Further, a side of the PCB away from the bottom case is also provided with the sealant layer.

The present disclosure further provides a display screen, including the display screen module as described above.

The beneficial effect of the present disclosure is that a sealant is provided in the gap between the PCB and the convex portion and the groove in the step portion. Even if there are cracks, gaps, etc., at the side wall of the convex portion, external moisture does not enter the internal of the display screen module, so that the waterproof performance is excellent.

DESCRIPTION OF REFERENCE NUMERALS

| Label | Name |
| --- | --- |
| 100 | Front maintenance display screen module |
| 1 | Bottom case |
| 2 | PCB |
| 21 | First notch |
| 22 | Second notch |
| 3 | Lamp bead |
| 4 | Through-hole structure |
| 41 | Convex portion |
| 42 | Step portion |
| 43 | Groove |
| 44 | Arc structure |
| 5 | Sealant layer |

The realization of the objective, functional characteristics, advantages of the present disclosure are further described with reference to the accompanying drawings.

DETAILED DESCRIPTION OF THE EMBODIMENTS

In order to explain in detail the technical contents, objectives, and effects of the present disclosure, the following description will be made in conjunction with the embodiments and the accompanying drawings.

The most critical idea of the present disclosure is that a sealant is both provided in the gap between the PCB and the convex portion and the groove in the step portion, and the waterproof performance is excellent.

Figure 1:
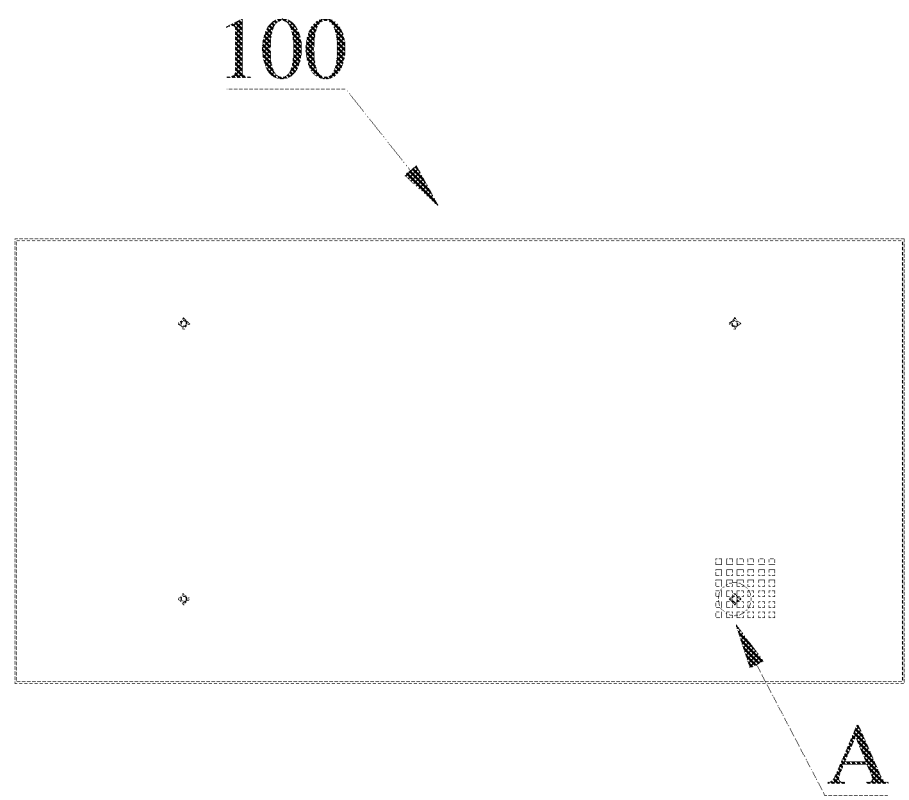
FIG. 1 is a front view of a front maintenance display screen module according to an embodiment of the present disclosure.
Figure 2:
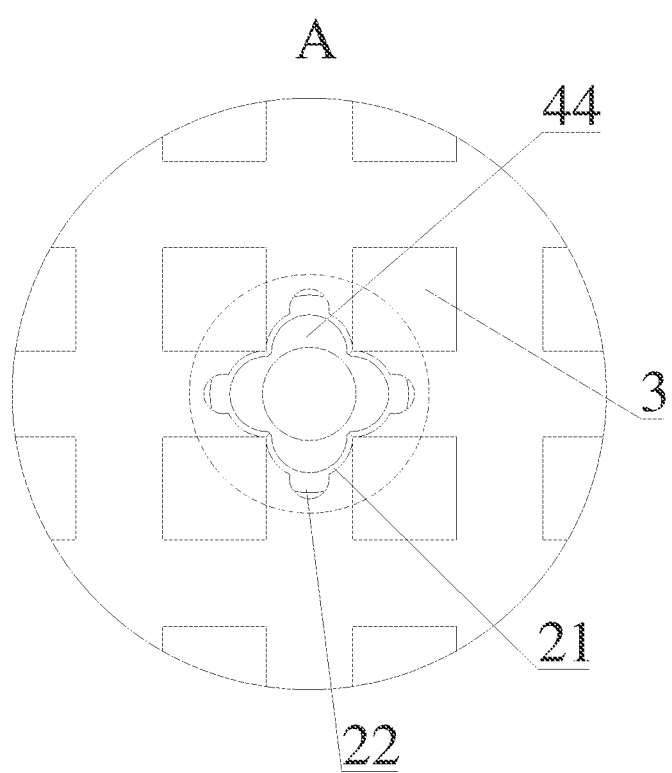
FIG. 2 is a schematic enlarged structure diagram of portion A in FIG. 1.
Figure 3:
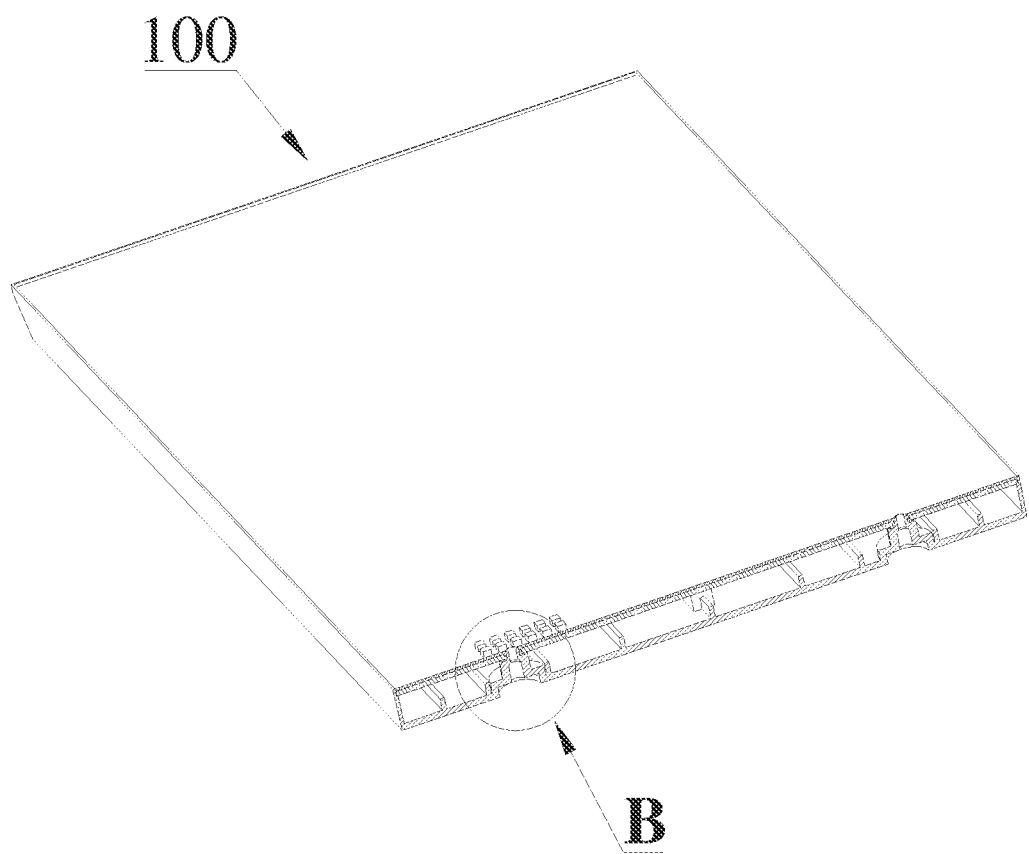
FIG. 3 is a cross-sectional view of the front maintenance display screen module according to an embodiment of the present disclosure.
Figure 4:
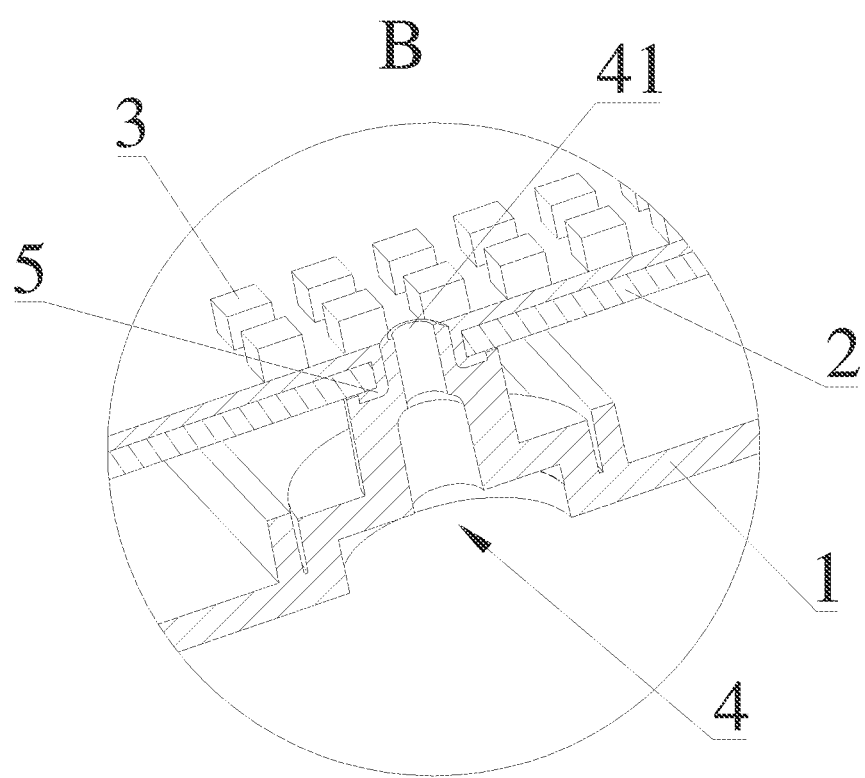
FIG. 4 is a schematic enlarged structure diagram of portion B in FIG. 3.
Figure 5:
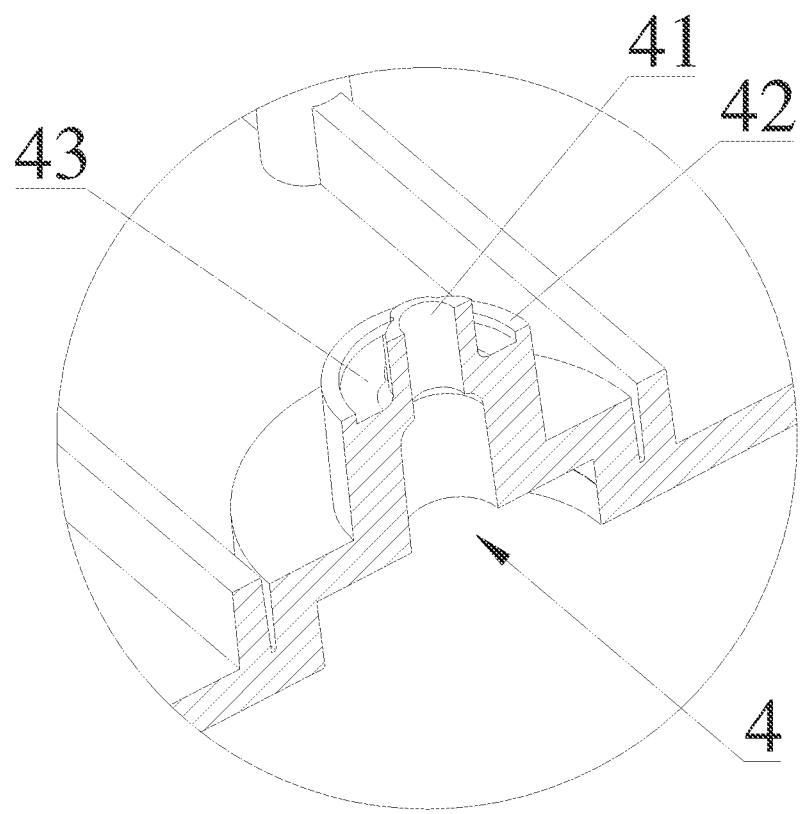
FIG. 5 is a partial cross-sectional view of the front maintenance display screen module according to an embodiment of the present disclosure.

Referring to FIG. 1 to FIG. 5, the present disclosure provides a front maintenance display screen module 100, including: a bottom case 1, a PCB 2 provided on the bottom case 1, and a through-hole structure 4 penetrating the bottom case 1 and the PCB 2. The through-hole structure 4 includes a step structure at one end of the through hole structure near the PCB 2, and the step structure includes a convex portion 41 and a step portion 42. The convex portion 41 is configured to penetrate the PCB 2, a gap is provided between the convex portion 41 and the PCB 2. The step portion 42 includes a groove 43 surrounding the convex portion 41. A side of the PCB 2 near the bottom case 1 is abutted against an edge of the groove 43. A sealant layer 5 is provided in the gap and the groove 43.

As can be seen from the above description, the beneficial effect of the present disclosure is that a sealant is both provided in the gap between the PCB and the convex portion and the groove in the step portion. Even if there are cracks, gaps, etc. on the side wall of the convex portion, external moisture does not enter the internal of the display screen module, and the waterproof performance is excellent.

Further, the convex portion 41 includes at least one arc structure 44 at an outer side wall of the convex portion 41 protruded from an outer side wall of the convex portion 41.

The arc structure on the convex portion can increase the thickness of the side wall of the convex portion and improve the mechanical properties.

Further, the PCB 2 includes a through hole. The convex portion 41 is located in the through hole. The through hole includes a first notch 21 corresponding to the arc structure 44, and the first notch 21 is arc-shaped. A radius of the first notch 21 is larger than that of the arc structure 44.

Further, the first notch 21 is also provided with a second notch 22.

The second notch is provided on the first notch to facilitate the flow of the sealant liquid into the groove.

Further, a plurality of lamp bead 3 are provided on the PCB 2, and the first notch 21 is located between two adjacent lamp beads 3.

The first notch is provided between two adjacent lamp beads. As such, it can achieve the purpose of sealing without affecting the arrangement of the lamp beads, and is suitable for the situation where the distance between the lamp beads is small.

Further, an outer diameter of the groove 43 is larger than a diameter of the through hole.

The diameter of the through hole being smaller than the outer diameter of the groove can improve the sealing effect.

Further, a rounded corner is provided at a joint between the convex portion 41 and the groove 43.

Further, the through-hole structure 4 is integrally formed with the bottom case 1.

Further, a side of the PCB 2 away from the bottom case 1 is also provided with the sealant layer 5.

A sealant layer is also provided on the PCB to further improve the sealing effect.

The present disclosure further provides a display screen, including the front maintenance display screen module 100 as described above.

Referring to FIG. 1 to FIG. 5, a first embodiment of the present disclosure is as follows.

The display screen includes a front maintenance display screen module 100, including: a bottom case 1, a PCB 2 provided on the bottom case 1, and a through-hole structure 4 penetrating the bottom case 1 and the PCB 2. In the present embodiment, the number of the through-hole structures 4 can be set as required, and the front-maintenance of the display screen module can be performed through the through-hole structure 4. The through-hole structure 4 may be integrally formed with the bottom case 1, or may be separately provided with the bottom case 1. The through-hole structure 4 includes a step structure at one end of the through hole structure near the PCB 2, and the step structure includes a convex portion 41 and a step portion 42. The convex portion 41 is configured to penetrate the PCB 2, a gap is provided between the convex portion 41 and the PCB 2. In the present embodiment, the PCB includes a through hole, and the convex portion 41 is located in the through hole. The step portion 42 includes a groove 43 surrounding the convex portion 41. A side of the PCB 2 near the bottom case 1 is abutted against an edge of the groove 43. A sealant layer 5 is both provided in the gap and the groove 43. Optionally, a side of the PCB 2 away from the bottom case 1 is also provided with the sealant layer 5. In order to improve the sealing effect, an outer diameter of the groove 43 is larger than a diameter of the through hole. Optionally, the convex portion 41 includes at least one arc structure 44 at an outer side wall of the convex portion 41, and the arc structure 44 is convex relative to the outer side wall of the convex portion 41. The number of arc structures 44 may be four. The through hole includes a first notch 21 corresponding to the arc structure 44, and the first notch 21 is arc-shaped. A radius of the first notch 21 is larger than that of the arc structure 44. The second notch 22 is provided on the first notch 21 to facilitate the flow of the sealant liquid into the groove 43. The shape of the second notch 22 can be set as required. In the present embodiment, a plurality of lamp bead 3 are provided on the PCB 2, and the first notch 21 is located between two adjacent lamp beads 3.

To sum up, the front maintenance display screen module and display screen provided by the present disclosure have good waterproof performance and are suitable for situations where the distance between the lamp beads is small.

The above are only embodiments of the present disclosure, and thus do not limit the patent scope of the present disclosure. Any equivalent transformations made by the contents of the specification and drawings of the disclosure, are directly or indirectly applied to related technical fields, and are equally included in the scope of the present disclosure.

What is claimed is:

1. A display screen module, comprising:
   a bottom case,
   a PCB provided on the bottom case, and
   a through-hole structure penetrating through the bottom case and the PCB, wherein:
   the through-hole structure comprises a step structure at one end of the through hole structure near the PCB, and the step structure comprises a convex portion and a step portion;
   the convex portion is configured to penetrate the PCB, a gap is provided between the convex portion and the PCB;
   the step portion comprises a groove surrounding the convex portion;
   a side of the PCB near the bottom case is abutted against an edge of the groove; and
   a sealant layer is provided in the gap and the groove;
   wherein the convex portion comprises at least one arc structure protruded from an outer side wall of the convex portion;
   the PCB comprises a through hole;

the convex portion is located in the through hole;

the through hole comprises a first notch corresponding to the arc structure, the first notch is arc-shaped; and a radius of the first notch is larger than that of the arc structure.

2. The display screen module of claim 1, wherein the first notch is also provided with a second notch.

3. The display screen module of claim 1, wherein a plurality of lamp beads are provided on the PCB, and the first notch is located between two adjacent lamp beads.

4. The display screen module of claim 1, wherein an outer diameter of the groove is larger than a diameter of the through hole.

5. The display screen module of claim 1, wherein a rounded corner is provided at a joint between the convex portion and the groove.

6. The display screen module of claim 1, wherein the through-hole structure is integrally formed with the bottom case.

7. The display screen module of claim 1, wherein a side of the PCB away from the bottom case is also provided with the sealant layer.

8. A display screen, comprising a display screen module comprising a bottom case, a PCB provided on the bottom case, and a through-hole structure penetrating through the bottom case and the PCB, wherein:

the through-hole structure comprises a step structure at one end of the through hole structure near the PCB, and the step structure comprises a convex portion and a step portion;

the convex portion is configured to penetrate the PCB, a gap is provided between the convex portion and the PCB;

the step portion comprises a groove surrounding the convex portion;

a side of the PCB near the bottom case is abutted against an edge of the groove;

a sealant layer is provided in the gap and the groove;

the convex portion comprises at least one arc structure protruded from an outer side wall of the convex portion;

the PCB comprises a through hole;

the convex portion is located in the through hole;

the through hole comprises a first notch corresponding to the arc structure, the first notch is arc-shaped; and a radius of the first notch is larger than that of the arc structure.

9. The display screen of claim 8, wherein the first notch is also provided with a second notch.

10. The display screen of claim 8, wherein a plurality of lamp beads are provided on the PCB, and the first notch is located between two adjacent lamp beads.

11. The display screen of claim 8, wherein an outer diameter of the groove is larger than a diameter of the through hole.

12. The display screen of claim 8, wherein a rounded corner is provided at a joint between the convex portion and the groove.

13. The display screen of claim 8, wherein the through-hole structure is integrally formed with the bottom case.

14. The display screen of claim 8, wherein a side of the PCB away from the bottom case is also provided with the sealant layer.

* * * * *